United States Patent [19]

Tajima

[11] Patent Number: 5,367,397
[45] Date of Patent: Nov. 22, 1994

[54] WAVELENGTH-STABILIZING METHOD AND ITS ASSOCIATED CIRCUITRY FOR AN OPTICAL COMMUNICATION SYSTEM

[75] Inventor: Tsutomu Tajima, Tokyo, Japan
[73] Assignee: NEC Corporation, Tokyo, Japan
[21] Appl. No.: 173,276
[22] Filed: Dec. 27, 1993

Related U.S. Application Data

[63] Continuation of Ser. No. 775,415, Oct. 15, 1991, abandoned.

[30] Foreign Application Priority Data

Oct. 15, 1990 [JP] Japan ................................ 2-273314

[51] Int. Cl.[5] ...................... H04B 10/12; H04B 10/08
[52] U.S. Cl. ................................ 359/152; 359/153; 359/161; 359/173; 359/110
[58] Field of Search ................ 359/110, 118, 152, 153, 359/154, 161, 162, 173, 177, 176, 156, 180, 190, 192, 193, 133, 166

[56] References Cited

U.S. PATENT DOCUMENTS

| | | | |
|---|---|---|---|
| 4,817,206 | 3/1989 | Calvani et al. | 359/181 |
| 4,888,817 | 12/1989 | Ryu et al. | 359/192 |
| 4,912,526 | 3/1990 | Iwaoka et al. | 359/181 |
| 4,965,858 | 10/1990 | Naito et al. | 359/192 |
| 5,052,051 | 9/1991 | Naito et al. | 359/192 |
| 5,142,402 | 8/1992 | Tsushima et al. | 359/192 |

FOREIGN PATENT DOCUMENTS

0039741  2/1990  Japan.

OTHER PUBLICATIONS

Shibutani et al, "A Study on an Active Square–Law Combining Method for a Polarization etc." IEEE Photonics Tech. Letters, vol. 1, No. 7, Jul. 1989.

Glance "Polarization Independent Coherent Optical Receiver" Journal of Lightwave Tech. vol. LT5, No. 2, Feb. 1987.

*Primary Examiner*—Richard E. Chilcot, Jr.
*Assistant Examiner*—Rafael Bacares
*Attorney, Agent, or Firm*—Foley & Lardner

[57] ABSTRACT

A wavelength-stabilizing method for use with an optical communication system capable of transmitting and receiving information by means of signal light between a pair of stations each having a coherent optical transmitter and a coherent optical receiver. This method is characterized in that each station transmits signal light while controlling its wavelength at the coherent optical transmitter and receives the incoming signal light together with the local light at a wavelength adjusted in accordance with the wavelength of the incoming signal light.

5 Claims, 5 Drawing Sheets

WAVELENGTH-STABILIZING METHOD AND ITS ASSOCIATED CIRCUITRY FOR AN OPTICAL COMMUNICATION SYSTEM

This application is a continuation of application Ser. No. 07/775,415, filed Oct. 15, 1991, now abandoned.

BACKGROUND OF THE INVENTION

This invention relates to a wavelength stabilizing method and its associated circuitry to be used for an optical communication system in which signal light is transmitted and received between a pair of stations each equipped with a coherent optical transmitter and a coherent optical receiver.

DESCRIPTION OF THE RELATED ART

A station to be used in an optical communication system is generally equipped as shown in FIG. 1. Each station, e.g. Stations A, B, is equipped with its respective coherent optical transmitter, 11A, 11B for sending out an optical signal to its opposite station. Each station is also equipped with its respective coherent optical receiver, 12A, 12B, etc., for receiving the corresponding optical signal from the same station. In each coherent optical transmitter, 11A, 11B, the generated light is modulated by the input digital signal either by means of Frequency-Shift-Keying (FSK) or by Phase-Shift-Keying (PSK) and is sent out to the corresponding optical transmission line, 100, 200, etc.

At the receiving end of the line, the incoming signal light and the light from the corresponding local light source, 13B, 13A are combined by means of the corresponding optical mixer, 14B, 14A and the resulting signal is supplied to the corresponding coherent optical receiver. The coherent optical receiver 12B, 12A serve to convert the beated signal light produced by the optical mixer, 14B, 14A, into an electric signal by means of a photo-diode and the electric signal is then demodulated. The coherent optical receiver being used in this description is a well-known receiver recommended in "A Study on an Active Square Law Method for a Polarization-Diversity Coherent Optical Receiver" published by M. Shibutani and S. Yamazaki in IEEE Photonics Technology Letters, Vol. 1, No. 7, July 1989. This receiver was also disclosed in a paper entitled "Polarization Independent Coherent Optical Receiver" published by B. Glance in the Journal of Light-Wave Technology, Vol. LT-5, No. 2, February, 1987.

A feature of this receiver is that it splits the incoming optical signal into two mutually perpendicularly-polarized component signals which are separately received by the optical-heterodyne technique. The derived pair of intermediate-frequency signals are demodulated independently and synthesized at the processing section. Thus, a composite demodulated signal of constant amplitude, irrespective of the polarized-plane conditions, is obtained. In an optical receiving system using the "polarization diversity" technique just explained, the two intermediate-frequency signals are independently demodulated and the resulting component signals are synthesized into an output signal at the baseband stage.

Suppose the signal light sent out by the coherent optical transmitter 11A at station A reaches Station B through optical fiber. (Here the modulation system used is irrelevant to the present discussion.) At station B, the output light from the local light source 13B is combined with the incoming signal light from station A by means of the light mixer 14B. The mixed optical signal is converted into an electrical signal by the coherent optical receiver 12B. In order to demodulate the incoming optical signal with a high degree of stability, the wavelength of the locally-generated light must be kept highly stable. Hence the converted electrical signal must always be monitored by monitoring equipment, and the local optical source 13B must be controlled precisely so that the wavelength of the locally-generated light is always kept constant. A similar construction is used when transmitting the signal light from the coherent optical transmitter 11B to the coherent optical receiver 12A at station A.

In conventional optical communication systems described in the preceding paragraph, the wavelengths of the coherent light transmitters are not controlled. Such systems are usually constructed so that the wavelengths of the light output of the local light sources are controlled by the coherent optical receiver, resulting in unavoidable fluctuation of the wavelengths of the light output from the transmitters caused by changes in the ambient temperature and weather. Consequently, local light sources capable of covering the wavelength variations of the output light are needed. These wavelength variations are very likely to cause instability in all of the transmission paths.

SUMMARY OF THE INVENTION

Accordingly, it is a general object of the present invention to provide a method together with its associated circuitry which are capable of minimizing the wavelength instability in optical communication systems.

To achieve the above object, the present invention provides a wavelength stabilizing method for use in an optical communication system employing the same optical frequency both for transmission and reception between two stations both equipped with a coherent optical transmitter and a coherent optical receiver. Referring to FIG. 2, the wavelength of the signal light output of the coherent optical transmitter at station B is controlled and transmitted to station A. The incoming signal light from station A is received at station B by controlling the light wavelength of the local light generated by the local light source.

Another object of the invention is to provide a method of stabilizing the light wavelength for use with an optical communication system wherein the light output from the coherent transmitter is split into two portions by an optical splitter. One of the portions is used as the signal light to be transmitted to the opposite station (station A). The output of the local light source is also split into two portions by another optical splitter. One of the output portions of the local light source is mixed with the incoming signal light from station A by means of the light mixer and applied to the coherent optical receiver as the input signal.

The remaining portion of the split signal light from the splitter is mixed with the remaining portion of the split light from the splitter of the optical mixer, and the mixed optical signal, after detection, serves to generate a control signal to be applied to the coherent optical transmitter by the control circuit in such a way that the control signal is applied to stabilize the wavelength of the output light from the transmitter.

It is a specific object of the invention to provide wavelength-stabilizing circuitry comprising a first optical splitter used to split signal light generated by a coherent optical transmitter installed in station B, a local light source capable of generating local light required to operate a coherent optical receiver to receive signal light transmitted from station A, a second optical splitter used to split local light, an optical mixer to mix a portion of locally generated light and a portion of the transmitting signal light split by the first optical splitter, a second optical mixer used to mix the remaining portion of locally-generated light and the signal light sent from station A, and a control circuit capable of controlling the coherent optical transmitter by detecting signal light mixed by the first optical mixer and reentering it into the coherent optical transmitter to stabilize the wavelength of the transmitting signal light.

It is still another object of this invention to provide a wavelength stabilizing circuit to be used in an optical communication system, a frequency control circuit capable of keeping the frequency difference between the frequency of the local light source and the middle value of the two frequency values of the received signal, one corresponding to "1" and the other corresponding to "0", at a constant value of 5 GHz.

DESCRIPTION OF THE PREFERRED EMBODIMENTS

Figure 1:
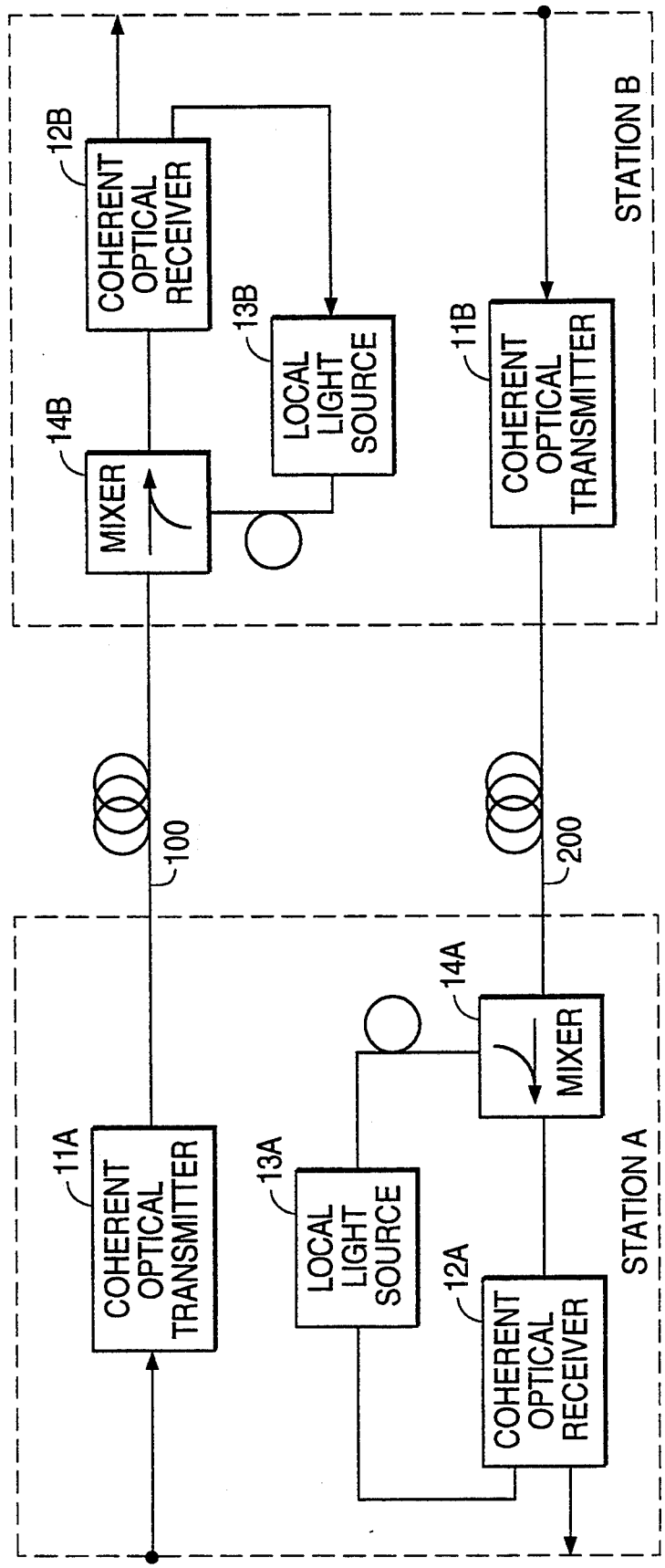
FIG. 1 is a block diagram of an embodiment of conventional wavelength stabilizing equipment used in an optical communication system.
Figure 2:
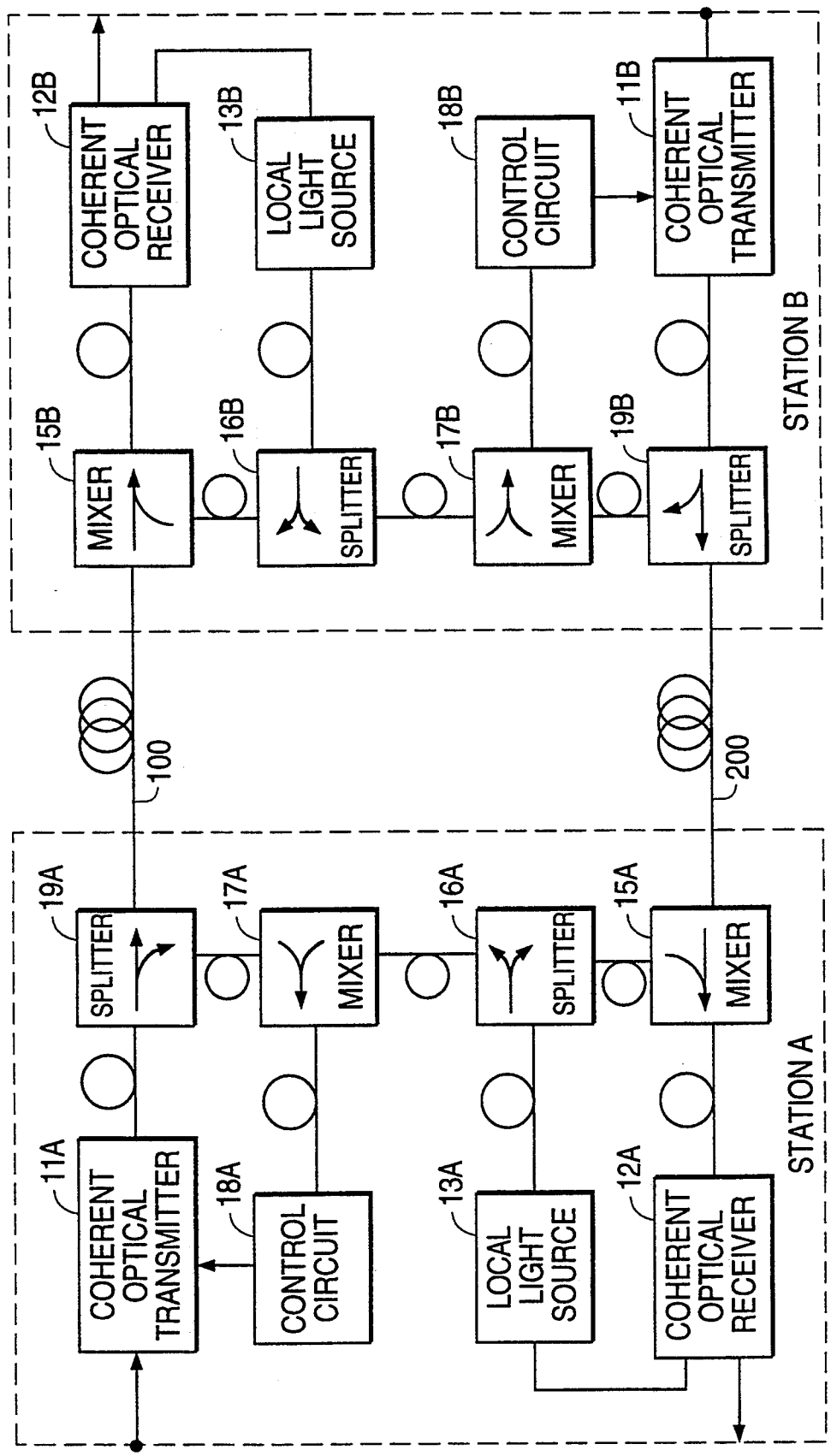
FIG. 2 is a block diagram of an embodiment of a wavelength-stabilizing apparatus according to the present invention for use in an optical communication system.

An embodiment of a typical embodiment of the present invention is explained below with reference to FIG. 2, which shows the block diagram of the invention.

The signal light of extremely stable wavelength is generated by the coherent optical transmitter 11A at station A and sent out to the optical transmission line 100. The signal light received from station B is mixed with the light generated by the local light source 13A by the optical mixer 15A. The mixed optical signal is then converted into an electrical signal by the coherent optical receiver 12A. The converted electrical signal is constantly monitored by means of monitoring equipment and, depending upon the signal conditions, the local light source 13A is subject to control. The construction of the local light source is such that the wavelength of the light transmitted is adjusted to correspond to the wavelength of the signal light sent from station B.

Thus, the wavelength of the signal light transmitted from the coherent optical transmitter 11A at station A, the wavelengths of the signal light transmitted from the coherent optical transmitter 11B at station B and of the generated light from the local light sources at both stations A and B are stabilized.

Figure 3:
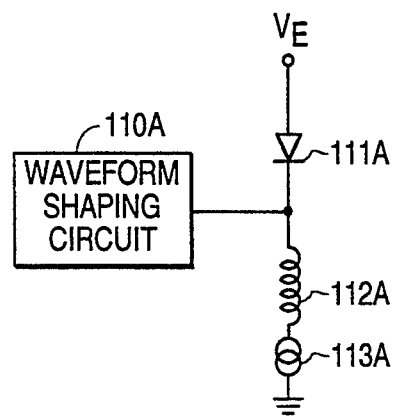
FIG. 3 is a block diagram of a coherent optical transmitter.

FIG. 3 shows the circuit diagram of the coherent optical transmitter 11A. The waveform-shaping circuit 110A receives a NRZ (Non Return to Zero) signal of 1.5 Mb/s as its input, shapes it into a perfect rectangular waveform, and then supplies it to the semiconductor laser LD111A.

Figure 4:
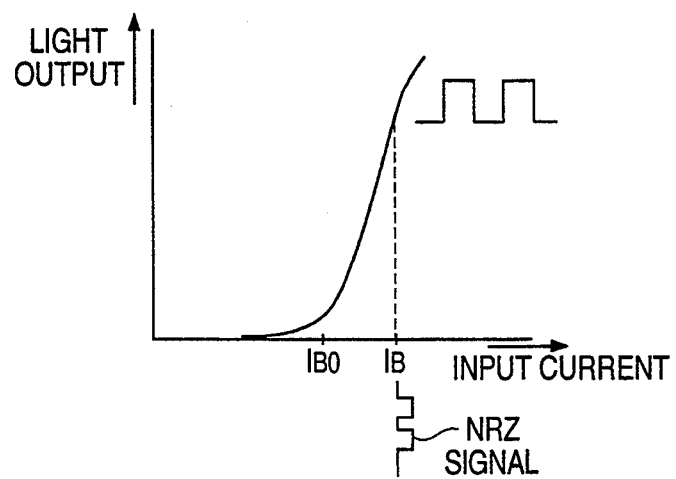
FIG. 4 is a diagram showing the relationship between the input current and the signal light output of the coherent optical transmitter.

The input-current versus light-output characteristic of the LD111A is shown in FIG. 4. The LD111A is a DFB laser capable of generating a single-wavelength optical signal having the frequency $3 \times 10^8 / 1.5 \times 10^{-6} = 2 \times 10^{14}$ Hz when a bias current $I_{b0}$ of ordinary magnitude and a value close to the threshold value is supplied from the bias-current source 113A through the inductance 112A and an NRZ signal of 1.5 Mb/s is supplied simultaneously. When such a high-frequency NRZ signal is supplied from the wave-shaping circuit 110A to the LD111A under the conditions of a high bias current $I_B$ whose value is considerably higher than the threshold value being applied, it is known that signal light having two different wavelength values will be generated in accordance with the NRZ signal codes corresponding to "1" and "0".

Figure 5:
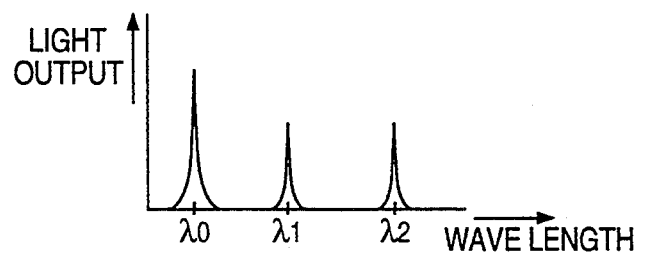
FIG. 5 shows the relationship between the input current and the light output of the semiconductor laser diode LD111A when the bias input current shown in FIG. 4 and the non-return-to-zero (NRZ) signal are supplied to the LD111A simultaneously.

In other words, when the NRZ signal and the bias current $I_B$ shown in FIG. 4 are supplied to the LD111A simultaneously, signal light of having two different wavelength values of $\lambda_1$ and $\lambda_2$ ($\lambda_1 < \lambda_2$) are generated as shown in FIG. 5. Here, the mid wavelength value between $\lambda_1$ and $\lambda_2$ is $\frac{1}{2} \times 10^{14}$ Hz. The frequency difference between the signal light values corresponding to the NRZ-signal values of "1" and "0" is 4 GHz. Incidentally, the frequency difference depends upon the amplitude of the NRZ signal. When a high frequency signal is input into the LD111A with a bias current which is much higher than the threshold value, the LD111A generates a signal light corresponding to the "0" and "1" of the NRZ signal. FSK modulation is carried out by this procedure. Incidentally, the output light of the LD111A is a stable light source.

Figure 6:
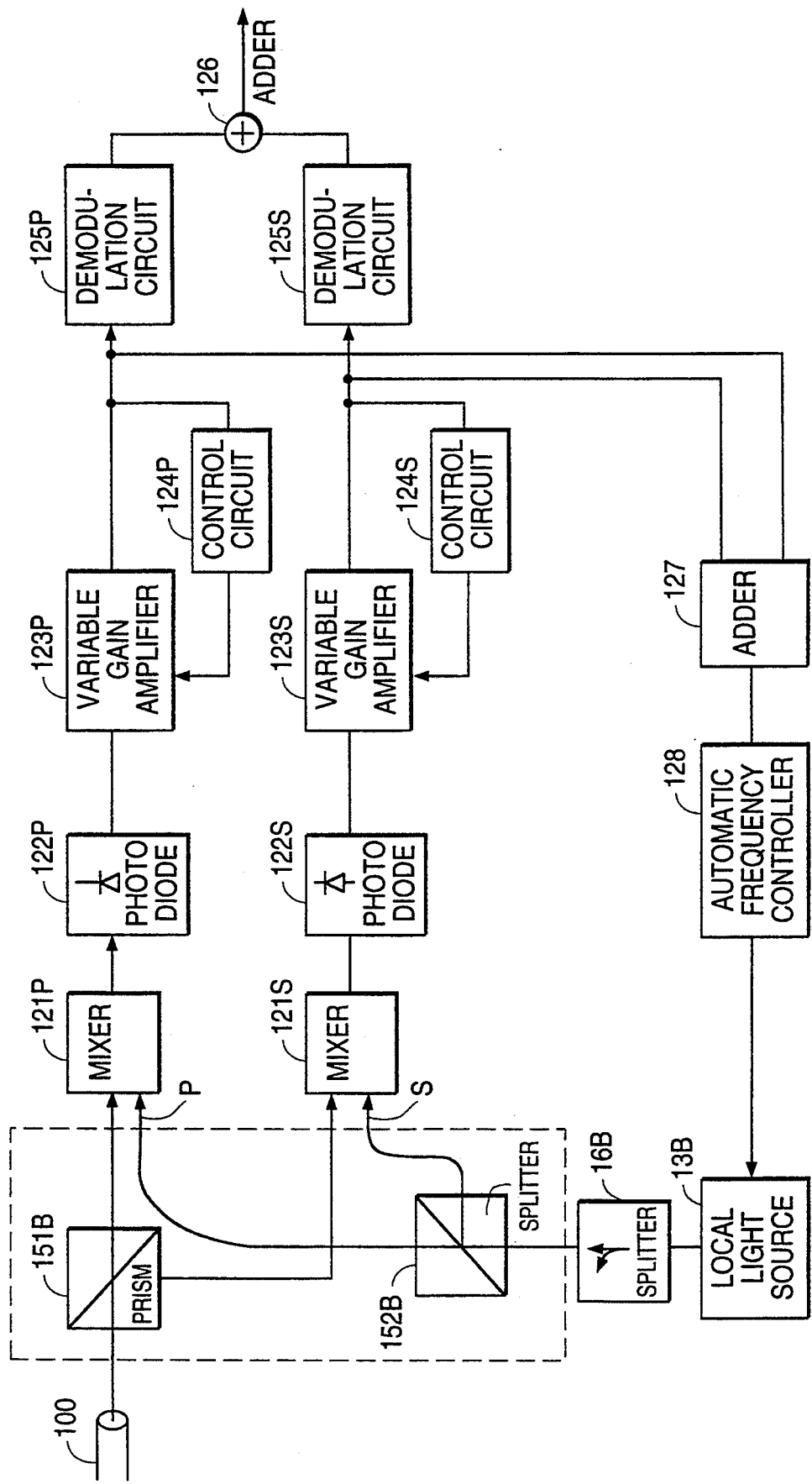
FIG. 6 is a detailed block diagram covering the receiving section of station B shown in FIG. 2 including the coherent optical receiver 12B, the local optical source 13B, the optical mixer 15B and the optical splitter 16B.

FIG. 6 shows a block diagram of the coherent optical receiver 12B, local light source 13B, optical mixer 15B and optical splitter 16B. The optical signal that has undergone FSK modulation coming in from the optical transmission line 100 is applied to the polarizing prism 151B. The polarization-diversity coherent optical receiver is shown in FIG. 6. This incoming optical signal is then split into two polarized light components of mutually perpendicular polarities known as "P" and "S" polarized light. The "P" component is incident to optical mixer 121P and the "S" component is incident to another optical mixer 121S through either one of the optical fibers, both of which are designed to preserve the polarization plane, whether it be "P" or "S". When the light output from the local light source 13B, a semiconductor laser, is incident upon the polarizing prism 152B through the optical splitter 16B, it is split into P and S components. The P or S component is incident upon the optical mixer 121P or 121S, respectively, through either one of the optical fibers, both of which are capable of preserving the corresponding plane of polarization.

The output light frequency of the local light source 13B is predetermined to be a suitable value to obtain an IF signal. In other words, the local light source 13B generates a local light having wavelength $\lambda_0$ which maintains the frequency difference between the mean value of light frequencies corresponding to received signal "1" and "0" and $\lambda_0$ at 5 GHz (the same as IF) in order to make the IF signal 5 GHz.

As the signal light and the light generated by the local light source are mixed by means of a pair of light mixers, 121P and 121S, optical beat signals whose frequencies are equal to the frequency difference of the two light signals are generated, and they are incident upon a pair of photo-diodes, 122P and 122S, respectively. Each photo-diode serves to convert the incident signal light into an electrical signal. In this case, since the photo-diodes essentially serve as square law detectors, two components of the signal light appear in the output of each photo-diode, these components differing in frequency and phase according to the difference between the incident light transmitted to the light mixers 121P and 121S and the light generated from the local light source.

The gains of the pair of variable gain amplifiers, 123P and 123S are always controlled to keep the output of each constant by means of a pair of control circuits 124P and 124S. The variable-gain amplifiers serve as the intermediate-frequency amplifiers and have an intermediate frequency and bandwidth of 5 GHz and 4 GHz, respectively. Since the outputs of the variable gain amplifiers 123P and 123S have phase differences corresponding to "1" or "0" of the signal light, respectively, the baseband signals "0" and "1" of the signal light are generated by means of the demodulation circuit, 125P and 125S, employing the technique of delayed detection. The outputs of 125P and 125S are added together by means of the signal adder 126.

Incidentally, in FIG. 6, another adder 127 and automatic-frequency controller (AFC) are provided as a compensation circuit for possible variation of the output wavelength of the local light source.

Since the beat frequency of the output of the light mixers, 121P and 121S, may fluctuate as the result of possible wavelength fluctuations of the output of the semiconductor laser, LD13B, the output-frequency of the variable intermediate-frequency amplifiers, 123P and 123S, may deviate from 5 GHz. In other words, the amplitude of the 5 GHz component of the output of the variable gain amplifiers 123P and 123S may fluctuate. The adder 127 detects and adds the 5 GHz from the output components of the variable gain amplifiers 123P and 123S and supplies the result to the automatic-frequency controller 128. It controls the laser diode 13B so that the laser output coincides with the nominal output level of adder 127. This results in stabilization of the output wavelength of laser LD13B. The nominal output level of the adder 127 is so designed as to coincide with its output level for the case in which the difference between the intermediate-frequencies, i.e., the output, of the variable gain amplifiers 123P and 123S is precisely 5 GHz. This can be realized by controlling the electric current through the Peltier element to cool the laser LD13B. In general, the output wavelength of a semiconductor laser is subject to temperature variations. This property can also be utilized to stabilize the output wavelength of a semiconductor laser. Generation and absorption of heat of the automatic frequency controller 128 are therefore controlled by controlling the electric current through the Peltier element.

Figure 7:
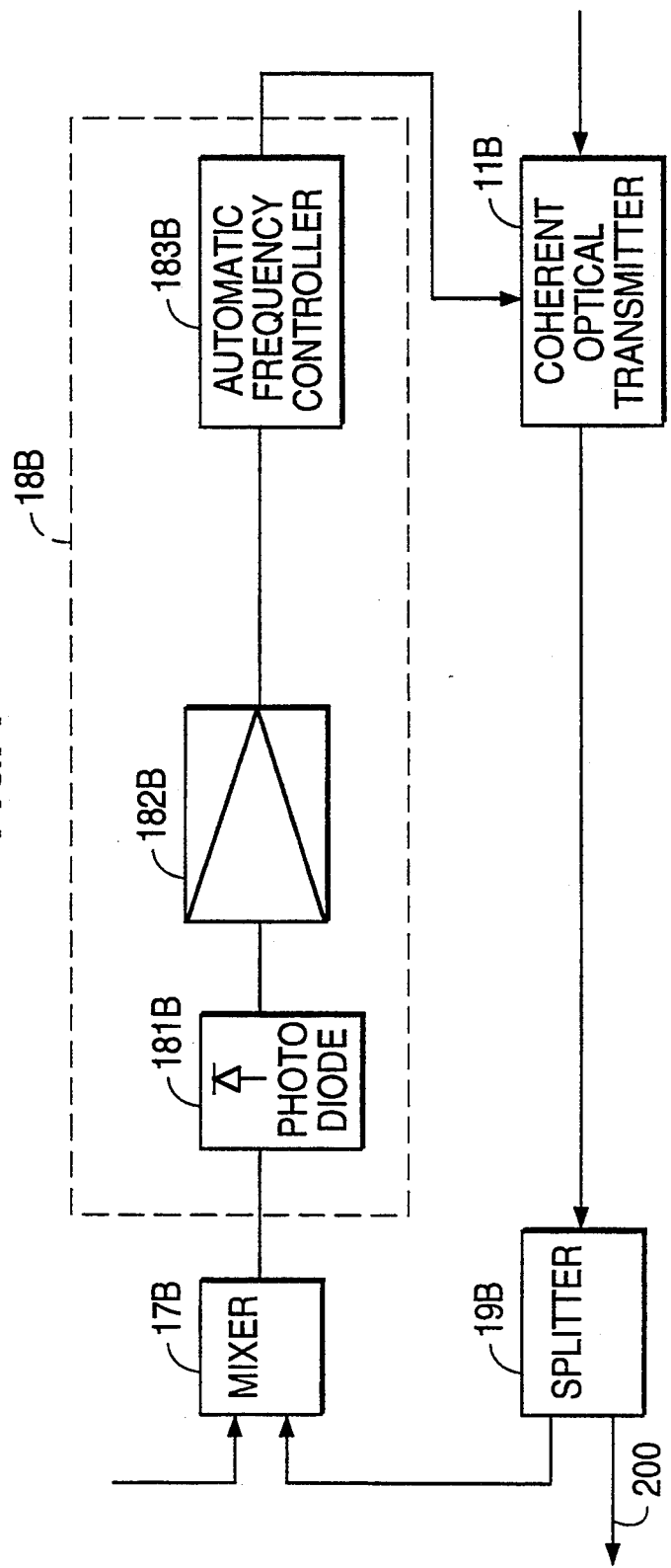
FIG. 7 is a detailed block diagram covering the transmitting section of station B shown in FIG. 2 and shows the coherent optical transmitter 11B, the optical splitter 19B, the optical mixer 17B and the control circuit 18B.

FIG. 7 is a block diagram of the transmitting section of station B, which consists of a coherent optical transmitter 11B, an optical splitter 19B, an optical mixer 17B and a control circuit 18B. The coherent optical transmitter 11B is identical with the coherent optical transmitter 11A already explained in FIG. 3. A beat signal having a frequency equal to the frequency difference between the optical frequencies of the output signal light from the coherent optical transmitter 11B that has been modified by the FSK technique and the local light from the local light source 13B generated by the mixer 17B can be converted into an electrical signal by means of the photo diode 181B. This signal that is amplified by the intermediate amplifier 182B, which has an intermediate frequency of 5 GHz. The wavelength of the output signal light of the automatic-frequency controller 183B is stabilized by temperature control of the semiconductor laser. As a matter of fact, since the optical output frequency of the laser in the coherent optical transmitter 11B fluctuates, the intermediate-frequency fluctuates and, as an unavoidable result, the output level of the automatic-frequency controller (AFC) 128B which operates close to the intermediate frequency of 5 GHz also fluctuates. In order to compensate for these fluctuations, the electric current through the Peltier element used to cool the laser in the coherent optical transmitter 11B is adjusted in accordance with changes in the level of the AFC 128B.

As has already been explained, the polarization diversity technique is employed in the coherent optical receiver of the embodiment. However, any other system of heterodyne detection, including PSK or DPSK, could be used to good effect. Digital modulation could also be successfully employed.

It is claimed:

1. A wavelength-stabilizing circuitry for stabilizing the wavelength of signal light in a communication system which is to transmit and receive signal light between a pair of stations, each equipped with a coherent optical transmitter, a coherent optical receiver, and local light source used for generating a local light required by the receiver to receive signal light being transmitted from the opposite station, wherein each of said stations comprises:

a first optical splitter for splitting the signal light transmitted by said coherent optical transmitter into first and second signal light portions;

a second optical splitter for splitting light from said local light source into first and second portions of said local light;

a first optical mixer for mixing a transmitted signal light transmitted by said opposite station and said first portion of said local light and supplying a first mixed signal to said coherent optical receiver;

a second optical mixer for mixing said second portion of said local light and a first portion of said transmitted signal light and supplying a second mixed signal; and a control circuit for controlling the coherent optical transmitter to stabilize the wavelength of the signal light by detecting an intermediate frequency signal from said second mixed signal from said second optical mixer by adjusting the wavelength of the signal from said coherent optical transmitter in accordance with the fluctuation of said intermediate frequency signal.

2. A wavelength-stabilizing circuitry for stabilizing the wavelength of signal light in a communication system according to claim 1, said control circuit comprising;
   an optical detector for detecting the mixed light from said second optical mixer and generating an electrical signal;
   an amplifier for amplifying the frequency difference between the frequency of the local light and the mid-frequency of the two frequencies which correspond to a value of "1" and "0" of the transmitted signal light; and
   a controller for controlling the wavelength of the signal from said coherent optical transmitter in accordance with the output signal level of said amplifier.

3. A wavelength stabilizing circuitry according to claim 2, further comprising:
   a pair of polarizing prisms for splitting the first portion of light from the local light source and the received signal light into their respective "S" and "P" components;
   a pair of optical mixers, one each for mixing the "S" components and the "P" components;
   a pair of photodetectors for receiving the mixed light signals and converting them into electrical signals;
   a pair of variable gain amplifiers for receiving the electrical signals, the outputs of each being kept constant by its own control circuit, the amplified signals being received both by a compensation circuit for the local light source and by a pair of demodulation circuits, which generate the baseband signals; and
   means for adding the baseband signals.

4. A wavelength stabilizing circuitry according to claim 1, further comprising:
   a pair of polarizing prisms for splitting the first portion of light from the local light source and the received signal light into their respective "S" and "P" components;
   a pair of optical mixers, one each for mixing the "S" components and the "P" components;
   a pair of photodetectors for receiving the mixed light signals and converting them into electrical signals;
   a pair of variable gain amplifiers for receiving the electrical signals, the outputs of each being kept constant by its own control circuit, the amplified signals being received both by a compensation circuit for the local light source and by a pair of demodulation circuits, which generate the baseband signals; and
   means for adding the baseband signals.

5. A wavelength-stabilizing method for use with an optical communication system capable of transmitting and receiving information by means of a signal light between a pair of stations, each station having a coherent optical transmitter and a coherent optical receiver, comprising the steps of:
   transmitting a signal light at a first wavelength at the coherent optical transmitter of a first station;
   splitting a signal light transmitted from said coherent optical transmitter of a second station into first and second portions and splitting a local light of said second station into first and second portions, said local light being adjusted in accordance with said first wavelength of said signal light transmitted from said first station;
   transmitting said first portion of said signal light to said first station;
   receiving said signal light transmitted by said first station with said first portion of said local light;
   applying to the coherent optical receiver of said second station a mixed signal composed of said first portion of light from the local light and the received signal light sent from said first station;
   mixing the second portion of light from said local light source and the second portion of said transmitted signal light; and
   controlling the coherent optical transmitter to stabilize the wavelength of the signal light by detecting the intermediate frequency signal from the mixed second portions of light by adjusting the wavelength of the signal from said coherent optical transmitter in accordance with the fluctuation of said intermediate frequency signal.

* * * * *